(12) United States Patent
Mokatren (10) Patent No.: US 8,248,142 B1
(45) Date of Patent: Aug. 21, 2012

(54) FAST LEVEL SHIFTER

(75) Inventor: Yamin Shibli Mokatren, Shibli-Umm Al-Ghanam (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 68 days.

(21) Appl. No.: 12/820,029

(22) Filed: Jun. 21, 2010

Related U.S. Application Data (60) Provisional application No. 61/220,699, filed on Jun. 26, 2009.

(51) Int. Cl.
*H03L 5/00* (2006.01)

(52) U.S. Cl. .............................. 327/333; 326/61; 326/80

(58) Field of Classification Search .............. 326/62–63, 326/80–82; 327/306, 333
See application file for complete search history.

(56) References Cited

U.S. PATENT DOCUMENTS

| | | | |
|---|---|---|---|
| 7,239,178 B1 * | 7/2007 | Cornell et al. | 326/81 |
| 7,365,569 B1 * | 4/2008 | Venugopal | 326/81 |
| 7,436,213 B2 * | 10/2008 | Nojiri | 326/81 |
| 7,629,830 B1 * | 12/2009 | Rubin | 327/333 |

* cited by examiner

*Primary Examiner* — Dinh T. Le (57) ABSTRACT

Some of the embodiments of the present disclosure provide a method comprising providing an integrated circuit with a level shifting circuit having a pull up device that is configured to selectively pull up a voltage level of an output signal from a low voltage level to a high voltage level, and having a pull down device that is configured to selectively pull down the voltage level of the output signal from the high voltage level to the low voltage level; ascertaining a high level of an input control signal; and when the output signal is at the high voltage level, deasserting the pull up device. Other embodiments are also described and claimed.

20 Claims, 6 Drawing Sheets

FAST LEVEL SHIFTER

CROSS REFERENCE TO RELATED APPLICATIONS

The present application claims priority to U.S. Patent Application No. 61/220,699, filed Jun. 26, 2009, the entire specification of which is hereby incorporated by reference in its entirety for all purposes, except for those sections, if any, that are inconsistent with this specification.

TECHNICAL FIELD

Embodiments of the present disclosure relate to circuits in general, and more specifically, to level shifters.

BACKGROUND

Unless otherwise indicated herein, the approaches described in this section are not prior art to the claims in this disclosure and are not admitted to be prior art by inclusion in this section.

Level shifters are utilized in integrated circuits for changing a voltage of a signal from a first voltage level to a second voltage level. A level shifter usually has at least one pull up transistor and at least one pull down transistor. The pull up transistor and the pull down transistor, in conjunction, shift a voltage of the signal to a desired voltage level. Conventionally the relative strengths of pull up transistors and pull down transistors are adjusted to minimize contamination among transistors that are configured to shift voltages in a different manner.

SUMMARY

In various embodiments, the present disclosure provides a method comprising providing an integrated circuit with a level shifting circuit having a pull up device that is configured to selectively pull up a voltage level of an output signal from a low voltage level to a high voltage level, and having a pull down device that is configured to selectively pull down the voltage level of the output signal from the high voltage level to the low voltage level; ascertaining a high level of an input control signal; and when the output signal is at the high voltage level, deasserting the pull up device.

There is also provided, in various embodiments, a level shifter comprising a pull up transistor adapted to be switched on in response to a transition of an input signal from a low level to a high level, wherein said switching on of the pull up transistor causes an output signal to be pulled up from a low voltage level to a high voltage level; a chopper circuit adapted to switch off the pull up transistor at an end of a delay period that starts in response to the output signal being pulled up to the high voltage level; and a pull down transistor adapted to be switched on in response to a transition of the input signal from the high level to the low level to cause the output signal to be pulled down from the high voltage level to the low voltage level.

There is also provided, in various embodiments, a method of operating a level shifter, the method comprising receiving an input signal that transitions from a low level to a high level at a first time; in response to the transition of the input signal from the low level to the high level, switching on a pull up transistor at the first time, wherein said switching on the pull up transistor causes an output signal to be pulled up from a low voltage level to a high voltage level; in response to the output signal being pulled up to the high voltage, switching off the pull up transistor at a second time that occurs subsequent to the first time; and in response to a transition of the input signal from the high level to the low level at a third time that occurs subsequent to the second time, switching on a pull down transistor, wherein said switching on the pull down device causes the output signal to be pulled down from the high voltage level to the low voltage level.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

Figure 1A:
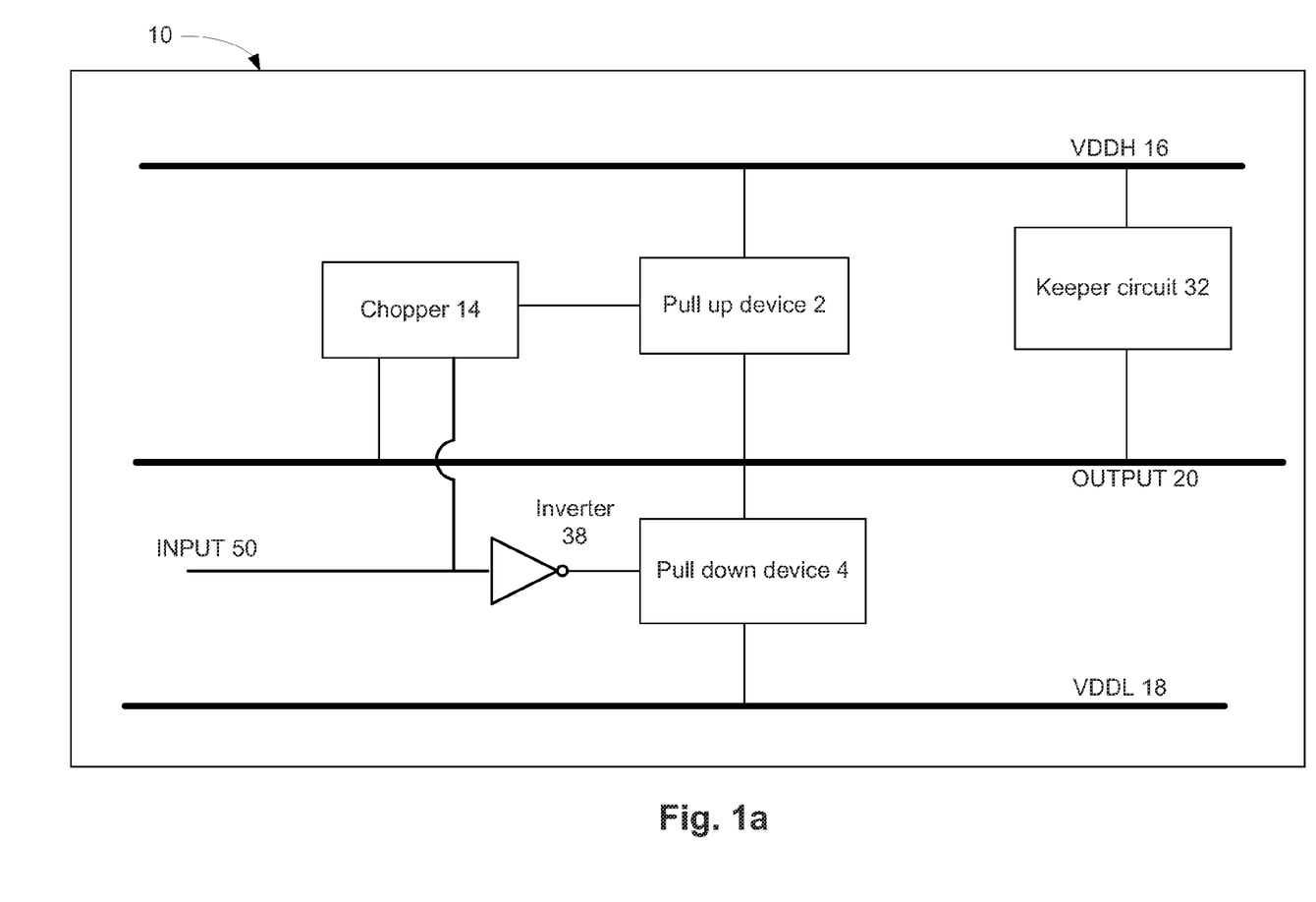
FIGS. 1a and 1b schematically illustrate a level shifter, in accordance with an embodiment of the present disclosure.

FIG. 1a schematically illustrates a level shifting circuit 10 (hereinafter also referred to as level shifter 10), in accordance with an embodiment of the present disclosure. The level shifter 10 may be included in, for example, an integrated circuit, a system-on-a-chip, and/or the like.

The level shifter 10 includes a pull up device 2 operatively coupled between a high voltage line VDDH 16 and an output signal 20 (henceforth also referred to as OUTPUT 20), and is controlled by an output of a chopper circuit 14 included in the level shifter 10. The chopper circuit 14 senses a voltage level of the OUTPUT 20. Based at least in part on the sensed voltage level of OUTPUT 20 and on an input signal 50, the chopper circuit 14 controls the pull up device 2. The level shifter 10 also includes a pull down device 4 operatively coupled between a low voltage line VDDL 18 and OUTPUT 20, and is controlled by an output of an inverter 38. The level shifter 10 also includes a keeper circuit 32 operatively coupled between the high voltage line VDDH 16 and OUTPUT 20, and is controlled by the OUTPUT 20.

The level shifter 10 is configured to selectively shift the OUTPUT 20 to about the voltage level of VDDH 16 or VDDL 18, based at least in part on a state of the input signal 50 (henceforth also referred to as INPUT 50, which is transmitted to an input of the inverter 38) of the level shifter 10, as discussed in more detail herein later.

The pull up device 2 is configured to selectively pull up a voltage level of OUTPUT 20 from a low voltage level (e.g., voltage level of VDDL 18) to a high voltage level (e.g., voltage level of VDDH 16), and the pull down device 4 is configured to selectively pull down the voltage level of the output signal from the high voltage level to the low voltage level. In various embodiments, based on assertion of a high level of INPUT 50, the pull up device 2 is asserted by the chopper circuit 14, which causes OUTPUT 20 to be pulled up from the low voltage level to the high voltage level. When OUTPUT 20 stabilizes at the high voltage level, the chopper circuit 14 deasserts the pull up device 2 based on sensing the OUTPUT 20. The keeper circuit 32 maintains OUTPUT 20 at the high voltage level from a time the pull up device is deasserted until the pull down device is asserted. In various embodiments, the pull up device is deasserted at an end of a delay period that starts in response to the output signal reaching the high voltage level, where the delay period is provided to allow sufficient time to stabilize OUTPUT 20 at the high voltage level and/or to complete an assertion of the keeper circuit 32.

While the OUTPUT 20 is maintained at the high voltage level by the keeper circuit 32, the INPUT 50 is asserted to a low level. In response to ascertaining the low level of INPUT 50, the pull down device 4 is asserted to cause OUTPUT 20 to be pulled down from the high voltage level to the low voltage level. While the OUTPUT 20 is pulled down from the high voltage level to the low voltage level by the pull down device 4, the keeper circuit 32 senses the decrease in the OUTPUT 20, and is deasserted based at least in part on such sensing.

Figure 1B:
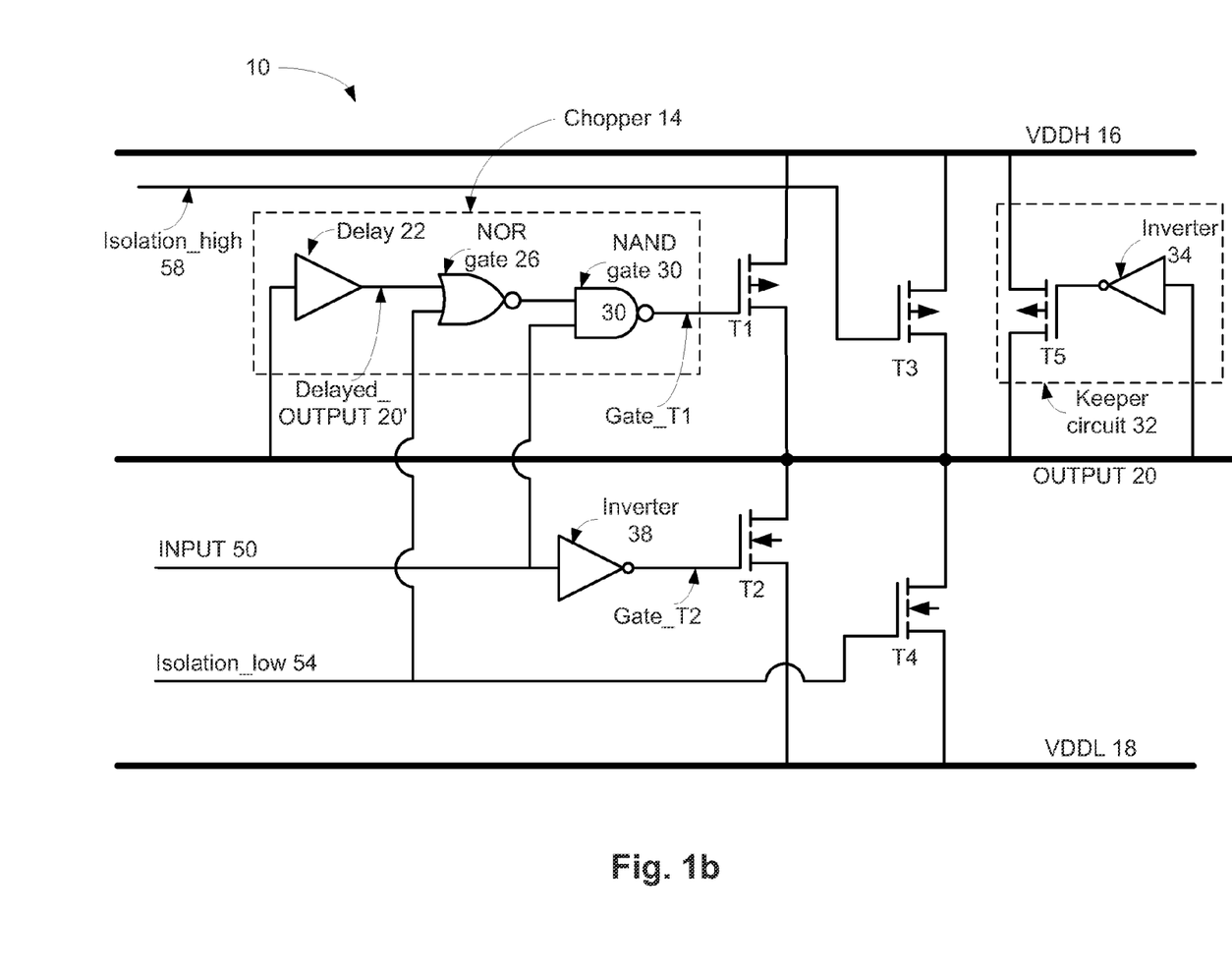

FIG. 1b schematically illustrates the level shifter 10 of FIG. 1a in more details, in accordance with an embodiment of the present disclosure. The pull up device 2 of FIG. 1a comprises a pull up transistor T1, and the pull down device 4 of FIG. 1a comprises a pull down transistor T2. In an embodiment, the pull up transistor T1 is a p-channel metal-oxide-semiconductor (PMOS) transistor and the pull down transistor T2 is an n-channel metal-oxide-semiconductor (NMOS) transistor, although in other embodiments other types of transistors can also be used.

As discussed with respect to FIG. 1a, in FIG. 1b the pull up transistor T1 is operatively coupled between the high voltage line VDDH 16 and the OUTPUT 20, and is controlled by an output of a logical NAND gate 30 (henceforth also referred to as NAND gate 30, included in the chopper circuit 14). For example, the pull up transistor T1 has a source terminal operatively coupled to VDDH 16, a gate terminal operatively coupled to the output of NAND gate 30, and a drain terminal operatively coupled to OUTPUT 20. The signal at the gate terminal of pull up transistor T1 is herein also referred to as Gate_T1.

The pull down transistor T2 is operatively coupled between the low voltage line VDDL 18 and OUTPUT 20, and is controlled by an output of the inverter 38. For example, the pull down transistor T2 has a source terminal operatively coupled to VDDL 18, a gate terminal operatively coupled to the output of the inverter 38, and a drain terminal operatively coupled to OUTPUT 20. The signal at the gate terminal of pull down transistor T2 is herein also referred to as Gate_T2.

A voltage level of VDDH 16 is relatively higher compared to a voltage level of VDDL 18. In an embodiment, the voltage level of VDDH 16 represents a high domain voltage of the level shifter 10, and the voltage level of VDDL 18 represents a low domain voltage of the level shifter 10. In an embodiment, although not illustrated in FIG. 1b, the VDDL 18 is operatively coupled to a ground terminal.

In an embodiment, the level shifter 10 is configured to selectively shift the OUTPUT 20 to about the voltage level of VDDH 16 or VDDL 18, based at least in part on a state of an input signal 50 (henceforth also referred to as INPUT 50) of the level shifter 10, as discussed in more detail herein later.

The chopper circuit 14 (illustrated as dotted lines in FIG. 1b for the purpose of illustrative clarity) includes a delay logic 22 (henceforth also referred to as delay 22), a logical NOR gate 26 (henceforth also referred to as NOR gate 26) and the NAND gate 30. As illustrated in FIG. 1b, the OUTPUT 20 is operatively coupled to an input of the delay 22, which outputs a delayed version of OUTPUT 20. The delayed version of OUTPUT 20 is henceforth also referred to as Delayed_OUTPUT 20', which is operatively coupled to an input of the NOR gate 26. The NOR gate 26 also receives an isolation_low signal 54 (henceforth also referred to as isolation_low 54). An output of the NOR gate 26 is operatively coupled to an input of the NAND gate 30. Another input of the NAND gate 30 is operatively coupled to the INPUT 50. The INPUT 50 is also operatively coupled to an input of the inverter 38.

The keeper circuit 32 (illustrated as dotted lines in FIG. 1b for the purpose of illustrative clarity) comprises a keeper transistor T5 and an inverter 34. The inverter 34 receives the OUTPUT 20. The keeper transistor T5 is operatively coupled between VDDH 16 and OUTPUT 20, and is controlled by an output of the inverter 34. For example, keeper transistor T5 has a source terminal operatively coupled to VDDH 16, a gate terminal operatively coupled to the output of the inverter 34, and a drain terminal operatively coupled to OUTPUT 20. In an embodiment, the keeper transistor T5 is a PMOS transistor, although in other embodiments other types of transistors can also be used.

Figure 2:
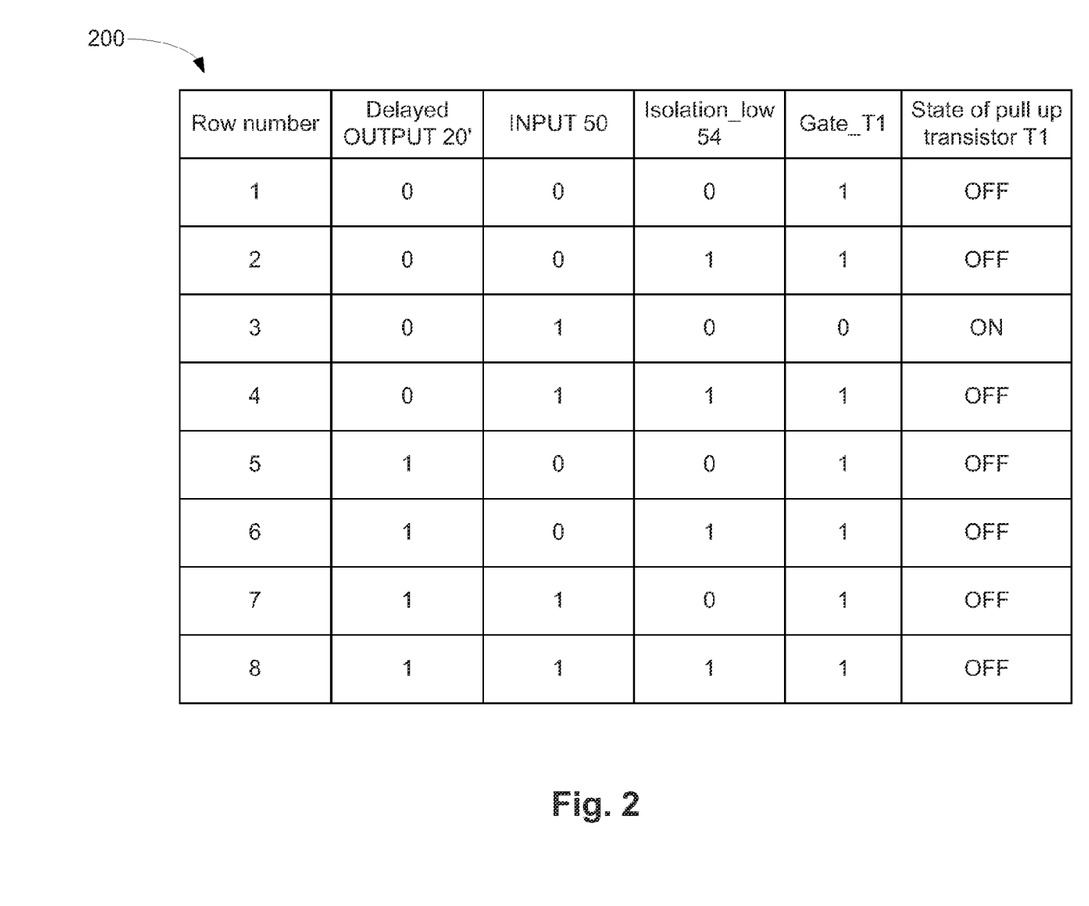
FIG. 2 illustrates an example truth table associated with a chopper circuit of the level shifter of FIGS. 1a and 1b, in accordance with an embodiment of the present disclosure.

Although not illustrated in FIG. 1a, in an embodiment, the level shifter 10 also includes an isolation high transistor T3 and an isolation low transistor T4. The isolation high transistor T3 is operatively coupled between VDDH 16 and OUTPUT 20, with a gate terminal being operatively coupled to an isolation_high signal 58 (henceforth also referred to as isolation_high 58). The isolation low transistor T4 is operatively coupled between VDDL 18 and OUTPUT 20, with a gate terminal being operatively coupled to isolation_low 54. The isolation high transistor T3 and an isolation low transistor T4 is configured to enable the level shifter 10 to operate as an isolator, in which the OUTPUT 20 is maintained at a deterministic voltage level through operations of the isolation high transistor T3 and the isolation low transistor T4, as will be explained in more detail herein later. FIG. 2 illustrates an example truth table 200 associated with the chopper 14, in accordance with an embodiment of the present disclosure. As will be discussed in more detail herein later (e.g., while discussing FIGS. 3-5 herein later), the truth table 200 illustrates how the chopper circuit 14 controls the operation of the pull up transistor T1, based at least in part on sensing the voltage level of the OUTPUT 20.

The truth table 200 illustrates logical values of the signal Gate_T1 in response to various logical values of signals Delayed_OUTPUT 20', INPUT 50 and Isolation_low 54. In the truth table 200, a logical value of 0 corresponds to a relatively low voltage level (e.g., a ground voltage, voltage level of VDDL 18, and/or the like), and a logical value of 1 corresponds to a relatively high voltage level (e.g., voltage level of VDDH 16 and/or the like). The truth table 200 also includes a state of the pull up transistor T1 (e.g., whether the pull up transistor T1 is switched on or off for various logical values of the signals in the truth table 200) in the case where the pull up transistor T1 is a PMOS transistor. The truth table 200 is developed based at least in part on the structure of the chopper 14 in FIGS. 1a and 1b.

As indicated in rows 5-8 of the truth table, when the Delayed_OUTPUT 20' is high, a voltage level of Gate_T1 is also high (e.g., irrespective of the values of INPUT 50 and/or Isolation_low 54), resulting in switching off of the transistor T1. Thus, as explained in more detail herein later, when a delayed version of OUTPUT 20 is high (e.g., when OUTPUT 20 has stabilized at a high voltage level), the pull up transistor T1 is switched off. The Gate_T1 is at a low voltage level and the pull up transistor T1 is switched on at least when (A) the Delayed_OUTPUT 20' is at a low voltage level (i.e., when a delayed version of the OUTPUT 20 is at a low voltage), (B) the INPUT 50 is at a high voltage level (i.e., when INPUT 50 is asserted to cause the level shifter 10 to shift OUTPUT 20 to the high voltage level), and (C) the Isolation_low 54 is at a low voltage level (i.e., when the isolation_low 54 does not prevent switching on of the pull up transistor T1). A detailed discussion of these conditions is provided herein later.

Figure 3:
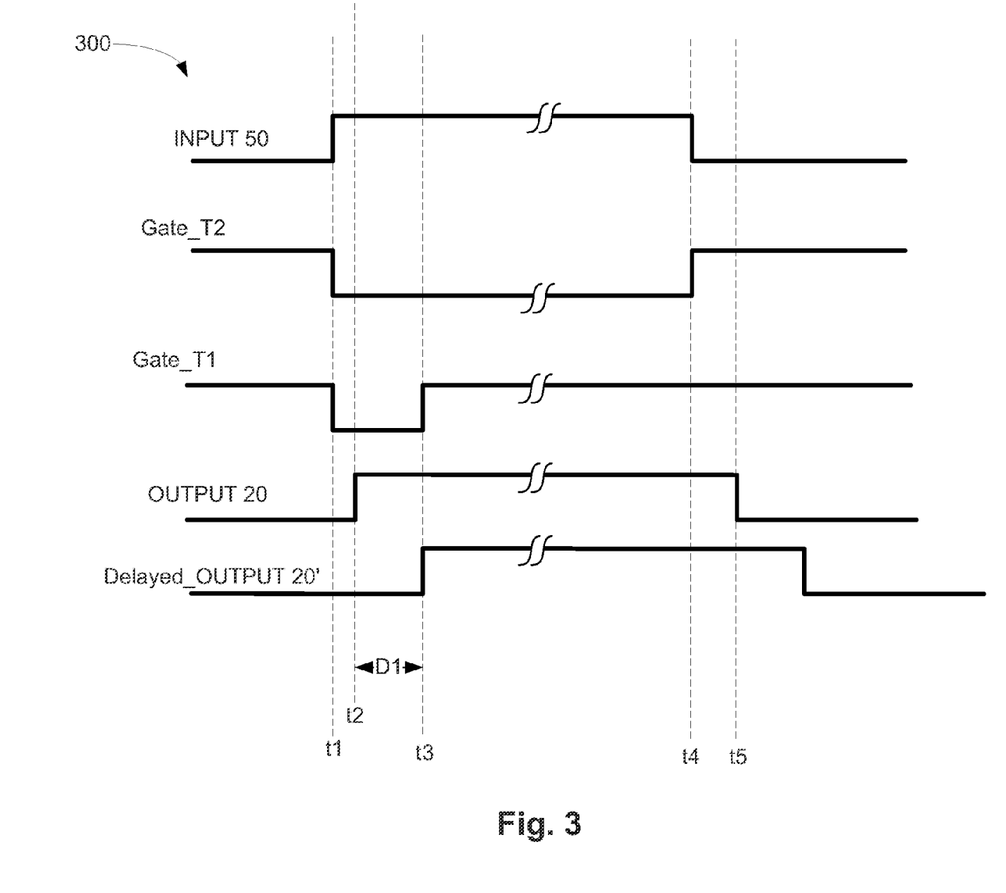
FIG. 3 illustrates an example timing diagram associated with an operation of the level shifter of FIGS. 1a and 1b, in accordance with an embodiment of the present disclosure.

FIG. 3 illustrates an example timing diagram 300 of various signals associated with an operation of the level shifter 10 of FIGS. 1a and 1b, in accordance with an embodiment of the present disclosure. The timing diagram 300 includes the input to the level shifter 10 (i.e., INPUT 50), gate voltage of pull down transistor T2 (i.e., Gate_T2), gate voltage of pull up transistor T1 (i.e., Gate_T1), the output signal of the level shifter 10 (i.e., OUTPUT 20), and the delayed version of the output signal (i.e., Delayed_OUTPUT 20'). In the timing diagram 300, it is assumed that Isolation_low 54 is maintained at a low voltage level, and Isolation_high 58 is maintained at a high voltage level.

As illustrated in FIG. 1b, INPUT 50 is inverted by the inverter 38 before reaching the pull down transistor T2. Accordingly, while INPUT 50 is initially low (e.g., before time t1, as illustrated in FIG. 3), Gate_T2 is at a high voltage level. Accordingly, the pull down transistor T2, which is an NMOS transistor, is switched on. Thus, the OUTPUT 20 is maintained at a low voltage level, i.e., at substantially the voltage level of VDDL 18. During this time (i.e., while INPUT 50 is initially low, before time t1), as the OUTPUT 20 is low (and the Delayed_OUTPUT 20' is also low), the Gate_T1 is at a high voltage level (e.g., as illustrated in the first row of the truth table 200) and the pull up transistor T1 (which is a PMOS transistor) is in an off state (e.g., is disabled or switched off).

At time t1, the input signal INPUT 50 transitions from the low voltage level to a high voltage level. Accordingly, Gate_T2 transitions, at time t1, from the high voltage level to the low voltage level, and the pull down transistor T2 switches off. Also, as the OUTPUT 20, before time t1, was low, so the delayed version of the OUTPUT 20 (i.e., Delayed_OUTPUT 20') is also low at time t1. Accordingly, as illustrated in the third row of the truth table 200, Gate_T1 transitions from a high voltage level to a low voltage level. Accordingly, the pull up transistor T1 is switched on, which pulls up the OUTPUT 20 to substantially a voltage level of VDDH 16. Thus, at time t2 (which occurs subsequent to time t1) the OUTPUT 20 transitions at the high voltage level. The time period between time t1 and time t2 is associated with the time taken for the pull up transistor T1 to switch on and/or to pull up the OUTPUT 20 to the high voltage level. In an embodiment, the time period between time t1 and time t2 is controlled by appropriately sizing and/or selecting the parameters of the pull up transistor T1. For example, the time period between time t1 and time t2 is based at least in part on how fast the pull up transistor stabilizes the OUTPUT 20, and/or how fast the keeper transistor T5 switches on to maintain the OUTPUT 20 at the high voltage level.

In response to the OUTPUT 20 transitioning to the high voltage level at time t2, the Delayed_OUTPUT 20' also transitions to the high voltage level at time t3. The time period between time t2 and time t3 (illustrated as delay D1) is associated with settings of delay 22 of the chopper 14. In an embodiment, the delay D1 is set, for example, based on the parameters of the pull up transistor T1, pull down transistor T2, keeper transistor T5, and/or one or more other parameters of the level shifter 14. In an embodiment, the delay D1 is set, for example, to allow sufficient time to stabilize the OUTPUT 20 at the high voltage level and/or to allow sufficient time for the keeper transistor T5 to switch on. In an embodiment, the delay D1 may be about 100 picoseconds.

Once the Delayed_OUTPUT 20' transitions to the high voltage at time t3, the Gate_T1 becomes high, as illustrated in the seventh row of the truth table 200. Accordingly, the pull up transistor T1 switches off at time t3.

Also, at time t2, while the OUTPUT 20 transitions to the high voltage level, due to the action of the inverter 34 in the keeper circuit 32, the gate voltage of the keeper transistor T5 transitions to the low voltage level. Accordingly, the keeper transistor T5, which is a PMOS transistor, switches on at time t2. Thus, between time t2 and time t3, both the pull up transistor T1 and the keeper transistor T5 operatively couples VDDH 16 to OUTPUT 20, thereby maintaining high voltage at OUTPUT 20.

At time t3, the pull up transistor T1 is switched off, as previously discussed. However, as the keeper transistor T5 is still switched on (as the OUTPUT 20, an inverted version of which controls the keeper transistor T5, is still maintained at the high voltage level by the keeper transistor T5), the keeper transistor T5 keeps or maintains the OUTPUT 20 at the high voltage level.

At time t4 occurring subsequent to time t3, the input signal INPUT 50 transitions to the low voltage level. Accordingly, the Gate_t2 transitions to the high voltage level at time t4, based on the inverter action of the inverter 38. Accordingly, at time t4, the pull down transistor T2 switches on, and tries to pull down OUTPUT 20 to VDDL 18.

As the voltage level of OUTPUT 20 decreases (e.g., due to the pull down action of the pull down transistor T2 at time t4), the gate voltage of the keeper transistor 32 increases, due to which the keeper transistor T5 switches off between time t4 and t5 (e.g., immediately after time t4, once the voltage level of OUTPUT 20 starts decreasing). Switching off the keeper transistor T5 prevents OUTPUT 20 from receiving high voltage from VDDH 16.

Accordingly, at time t5 (which occurs subsequent to time t4), OUTPUT 20 transitions to substantially the low voltage level of VDDL 18.

The time period between time t4 and time t5 is associated with the time taken for the pull down transistor T2 to switch on, the keeper transistor T5 to switch off, and to pull down the OUTPUT 20 to the low voltage level. In an embodiment, the time period between time t4 and time t5 can be controlled by appropriately sizing and/or selecting the parameters of the pull down transistor T2 and/or the keeper transistor T5.

Thus, in the embodiment described with respect to level shifter 10, the chopper 14 switches off the pull up transistor T1 shortly after (e.g., with delay D1, as illustrated in FIG. 3) OUTPUT 20 reaches high voltage level. Accordingly, when the pull down transistor T2 is switched on (e.g., at time t4) to pull down the voltage level of the OUTPUT 20 (e.g., based on deassertion of INPUT 50), the pull up transistor T1 is already switched off (e.g., at time t3). Hence, unlike a conventional level shifter, while switching on the pull down transistor T2 of the level shifter 10 (e.g., at time t4), the pull down transistor T2 does not need to compete with the pull up transistor T1, and the pull down transistor T2 does not need to over-power the pull up transistor T1. Accordingly, the strength of the pull up transistor T1 in the level shifter 10 can be selected independent of the strength of the pull down transistor T2. For example, in an embodiment, the pull up transistor T1 can be made as strong as the pull down transistor T2. Having a relatively strong pull up transistor T1 has several advantages (e.g., less leakage current in the pull up transistor T1, fast switching of the pull up transistor T1 resulting is a relatively fast pull up of the OUTPUT 20, achieving a fast and desired pull up speed, and/or the like). In contrast, in a conventional level shifter, a pull up transistor is generally made weaker than a pull down transistor, to enable the pull down transistor to successfully compete with the pull up transistor, and to enable the pull down transistor to over-power the pull up transistor while pulling down an output signal to a low voltage level.

In an embodiment, the level shifter 10 also operates as an isolator, in which the OUTPUT 20 is maintained at a deterministic voltage level through operations of the isolation high transistor T3 and the isolation low transistor T4.

For example, for regular operation of the level shifter discussed above with respect to FIGS. 2 and 3, it was assumed that Isolation_low 54 is maintained at a low voltage level, and Isolation_high 58 is maintained at a high voltage level. However, there may be a situation where the chopper 14, inverter 38, inverter 34, and/or one or more other components of the level sifter 10 is not operational (e.g., powered down and/or isolated from one or more circuit components associated with the level shifter 10). In such a situation (and/or in any other appropriate situations), if the Isolation_low 54 transitions to a high voltage level, the isolation low transistor T4 is switched on, thereby pulling down the OUTPUT 20 to the low voltage level. Also, in such a situation, if the Isolation_high 54 transitions to a low voltage level, the isolation high transistor T4 is switched on, thereby pulling up the OUTPUT 20 to the high voltage level.

Also, if the Isolation_low 54 transitions to the high voltage level, the pull up transistor T1 is off, irrespective of the values of INPUT 50 and OUTPUT 20, as illustrated in the truth table 200. Thus, while the Isolation_low 54 is high, there is no possibility of the pull up transistor T1 pulling the OUTPUT 20 to a high voltage level.

Figure 4:
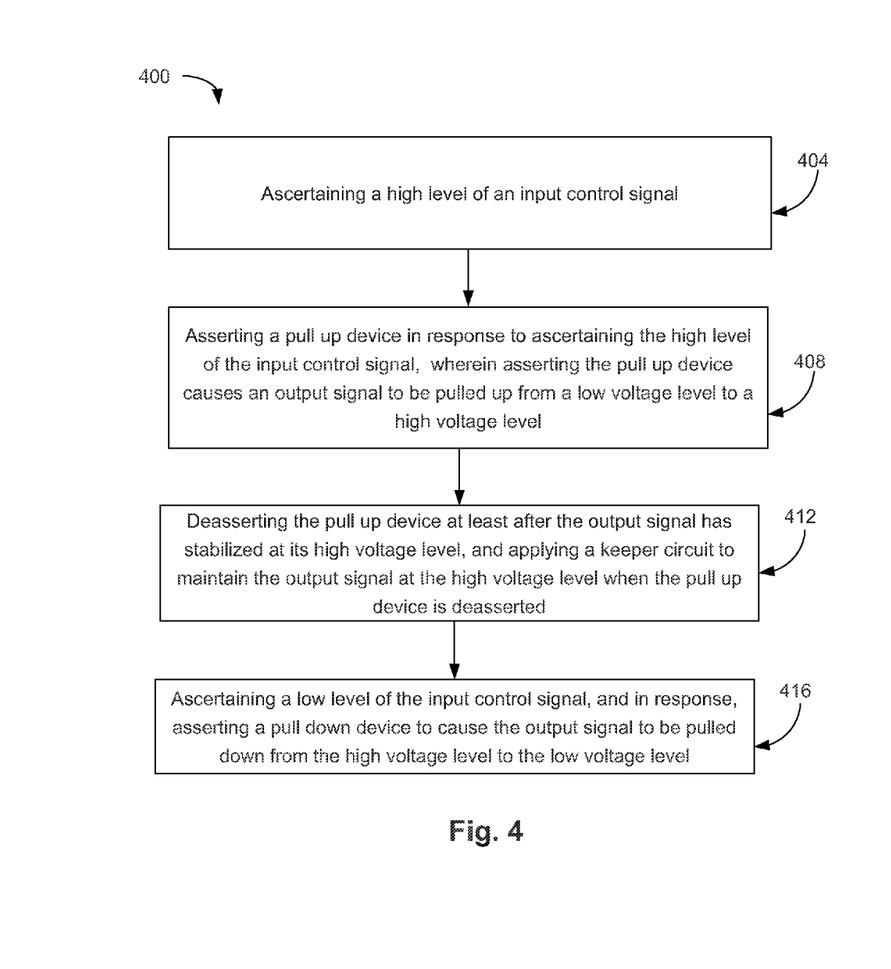
FIGS. 4 and 5 illustrate methods for operating the level shifter of FIGS. 1a and 1b, in accordance with an embodiment of the present disclosure.

FIG. 4 illustrates a method 400 for operating the level shifter 10 of FIGS. 1a and 1b, in accordance with an embodiment of the present disclosure. Referring to FIGS. 1a-4, the method 400 includes, at 404, ascertaining a high level of an input control signal (e.g., INPUT 50).

The method 400 further includes, at 408, asserting a pull up device (e.g., switching on the pull up transistor T1) in response to ascertaining the high level of the input control signal, where asserting the pull up device causes an output signal (OUTPUT 20) to be pulled up from a low voltage level (e.g., from at about the voltage level of VDDL 18) to a high voltage level (e.g., to at about the voltage level of VDDH 16).

The method 400 further includes, at 412, deasserting (e.g., switching off) the pull up device at least after the output signal has stabilized at its high voltage level, and applying a keeper circuit (e.g., the keeper transistor T5) to maintain the output signal at the high voltage level when the pull up device is deasserted.

The method 400 further includes, at 416, ascertaining a low level of the input control signal, and in response, asserting a pull down device (e.g., switching on the pull down transistor T2) to cause the output signal to be pulled down from the high voltage level to the low voltage level.

Figure 5:
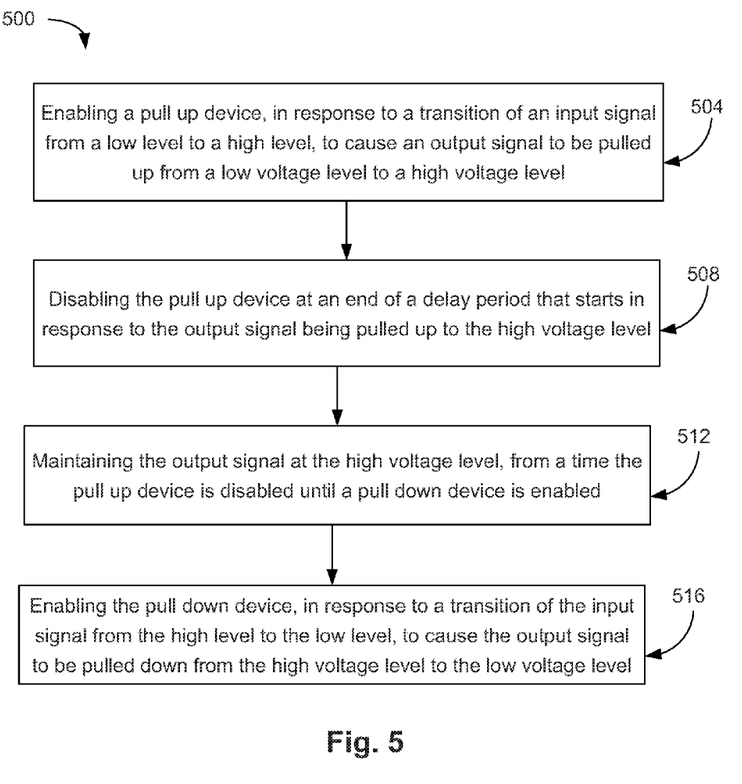

FIG. 5 illustrates another method 500 for operating the level shifter 10 of FIGS. 1a and 1b, in accordance with an embodiment of the present disclosure. Referring to FIGS. 1a, 1b-3 and 5, the method 500 includes, at 504, enabling (e.g., switching on) a pull up device (e.g., the pull up transistor T1), in response to a transition of an input signal INPUT 50 from a low level to a high level, to cause an output signal OUTPUT 20 to be pulled up from a low voltage level (e.g., from at about the voltage level of VDDL 18) to a high voltage level (e.g., to at about the voltage level of VDDH 16).

The method 500 further includes, at 504, disabling (e.g., switching off) the pull up device at an end of a delay period that starts in response to the output signal being pulled up to the high voltage level. For example, as illustrated in FIG. 3, the pull up transistor T1 is switched off at time t3, i.e., at the end of the delay period D1, where the delay period D1 starts at time t2 in response to OUTPUT 20 transitioning to the high voltage level.

The method 500 further includes, at 508, maintaining (e.g., by the keeper transistor T5) the output signal at the high voltage level, from a time the pull up device is disabled (e.g., from time t3) until a pull down device (e.g., pull down transistor T2) is enabled (e.g., until time t4).

The method 500 further includes, at 516, enabling the pull down device (e.g., at time t4), in response to a transition of the input signal from the high level to the low level, to cause the output signal to be pulled down from the high voltage level to the low voltage level. For example, as illustrated in FIG. 3, the pull down transistor T2 is switched on at time t4 in response to INPUT 50 transitioning to the low voltage level, based on which OUTPUT 20 transitions to the low voltage level (e.g., pulled down to about the voltage level of VDDL 18 by the pull down transistor T2) at time t5.

Although specific embodiments have been illustrated and described herein, it will be appreciated by those of ordinary skill in the art and others, that a wide variety of alternate and/or equivalent implementations may be substituted for the specific embodiment shown and described without departing from the scope of the present disclosure. This disclosure covers all methods, apparatus, and articles of manufacture fairly falling within the scope of the appended claims either literally or under the doctrine of equivalents. This application is intended to cover any adaptations or variations of the embodiment discussed herein. Therefore, it is manifested and intended that the disclosure be limited only by the claims and the equivalents thereof.

What is claimed is:

1. A method comprising:
   providing an integrated circuit with a level shifting circuit having
      a pull up device coupled between a high voltage line and an output terminal, wherein the pull up device is configured to selectively pull up a voltage level of an output signal at the output terminal from a low voltage level to a high voltage level,
      a chopper circuit comprising a delay logic and a gate circuit, wherein the chopper circuit is configured to (i) receive the output signal and an input control signal, (ii) generate a delayed version of the output signal using the delay logic, (iii) based on the delayed version of the output signal and the input control signal, generate a switching signal, and
      a pull down device coupled between a low voltage line and the output terminal, wherein the pull down transistor is configured to selectively pull down the voltage level of the output signal from the high voltage level to the low voltage level;
   ascertaining a high level of the input control signal; and
   when the output signal is at the high voltage level, deasserting, based on the switching signal, the pull up device at an end of a delay period that starts in response to the output signal reaching the high voltage level.

2. The method of claim 1, further comprising:
   asserting the pull up device in response to ascertaining the high level of the input control signal, wherein asserting the pull up device causes the output signal to be pulled up from the low voltage level to the high voltage level, and deasserting the pull up device at least after the output signal has stabilized at its high voltage level.

3. The method of claim 1, wherein the delay period is provided to allow sufficient time to stabilize the output signal at the high voltage level or to complete an assertion of a keeper circuit.

4. The method of claim 1, further comprising:
ascertaining a low level of the input control signal; and
in response to ascertaining the low level of the input control signal, asserting the pull down device to cause the output signal to be pulled down from the high voltage level to the low voltage level.

5. The method of claim 1, further comprising:
enabling a keeper circuit, based on output signal reaching the high voltage level, to maintain the output signal at the high voltage level when the pull up device is deasserted.

6. The method of claim 5, further comprising:
in response to a drop in a voltage level of the output signal while the output signal is being maintained at the high voltage level, disabling the keeper device.

7. A level shifter comprising:
a pull up transistor coupled between a high voltage line and an output terminal, wherein the pull up transistor is configured to be switched on in response to a transition of an input signal from a low level to a high level, wherein said switching on of the pull up transistor causes an output signal at the output terminal to be pulled up from a low voltage level to a high voltage level;
a chopper circuit comprising a delay logic and a gate circuit, wherein the chopper circuit is configured to (i) receive the output signal and the input signal, (ii) generate a delayed version of the output signal using the delay logic, (iii) based on the delayed version of the output signal and the input signal, generate a switching signal, and (iv) based on the switching signal, switch off the pull up transistor at an end of a delay period that starts in response to the output signal being pulled up to the high voltage level; and
a pull down transistor coupled between a low voltage line and the output terminal, wherein the pull down transistor is configured to be switched on in response to a transition of the input signal from the high level to the low level to cause the output signal to be pulled down from the high voltage level to the low voltage level.

8. The level shifter of claim 7, further comprising:
a keeper transistor adapted to be switched on in response to the output signal being pulled up to the high voltage level.

9. The level shifter of claim 8, wherein the keeper transistor is further adapted to maintain the output signal at the high voltage level, from a time the pull up transistor is switched off until the pull down transistor is switched on.

10. The level shifter of claim 8, wherein the keeper transistor is further adapted to be switched off in response to a drop in the output signal while the output signal is being pulled down to the low voltage level.

11. The level shifter of claim 7, wherein the delay period is defined to allow sufficient time to stabilize the output signal at the high voltage level or to allow proper switching on of the keeper transistor.

12. The level shifter of claim 7, wherein the pull down transistor is switched on after switching off of the pull up transistor.

13. The level shifter of claim 7, wherein the gate circuit comprises:
a logical NOR gate adapted to receive at least the delayed version of the output signal; and
a logical NAND gate adapted to (i) receive an output of the logical NOR gate and the input signal, and (ii) generate the switching signal.

14. The level shifter of claim 8, wherein the pull up transistor is a p-channel metal-oxide-semiconductor (PMOS) transistor, the pull down transistor is an re-channel metal-oxide-semiconductor (NMOS) transistor, and the keeper transistor is a PMOS transistor.

15. The level shifter of claim 8, further comprising:
an inverter adapted to receive the output signal and to control a gate terminal of the keeper transistor.

16. The level shifter of claim 7, further comprising:
an inverter adapted to receive the input signal and to control a gate terminal of the pull down transistor.

17. The level shifter of claim 7, further comprising:
an isolation low transistor adapted to pull down the output signal from the high voltage level to the low voltage level in response to an isolation low signal; and
an isolation high transistor adapted to pull up the output signal from the low voltage level to the high voltage level in response to an isolation high signal.

18. A method of operating a level shifter, the method comprising:
receiving an input signal that transitions from a low level to a high level at a first time;
in response to the transition of the input signal from the low level to the high level, switching on a pull up transistor at the first time, wherein said switching on the pull up transistor causes an output signal at an output terminal to be pulled up from a low voltage level to a high voltage level, wherein the pull up transistor is coupled between a high voltage line and the output terminal;
generating, by a delay logic included in a chopper circuit, a delayed version of the output signal, wherein the delayed version of the output signal is pulled up from the low voltage level to the high voltage level at a second time that occurs subsequent to the first time:
generating, by a gate circuit included in the chopper circuit, a switching signal based on the delayed version of the output signal;
based on the switching signal, switching off the pull up transistor at the second time; and
in response to a transition of the input signal from the high level to the low level at a third time that occurs subsequent to the second time, switching on a pull down transistor, wherein said switching on the pull down device causes the output signal to be pulled down from the high voltage level to the low voltage level, wherein the pull down transistor is coupled between a low voltage line and the output terminal.

19. The method of claim 18, further comprising:
in response to the output signal being pulled up to the high voltage level, switching on a keeper transistor; and
maintaining, using the keeper transistor, the output signal at the high voltage level, from the second time until the third time.

20. The method of claim 19, further comprising:
switching off the keeper transistor at around the third time.

* * * * *